(12) United States Patent
Cheung

(10) Patent No.: US 7,755,260 B2
(45) Date of Patent: Jul. 13, 2010

(54) NICKEL STRUCTURES AND METHODS FOR MANUFACTURING THE SAME BY REMOVAL OF AN UNDERLYING MATERIAL

(75) Inventor: Patrick C. P. Cheung, Castro Valley, CA (US)

(73) Assignee: Palo Alto Research Center Incorporated, Palo Alto, CA (US)

( * ) Notice: Subject to any disclaimer, the term of this patent is extended or adjusted under 35 U.S.C. 154(b) by 92 days.

(21) Appl. No.: 12/045,523

(22) Filed: Mar. 10, 2008

(65) Prior Publication Data

US 2009/0226665 A1  Sep. 10, 2009

(51) Int. Cl.
  *H01L 41/053* (2006.01)
  *H01L 41/047* (2006.01)
(52) U.S. Cl. ...................... 310/348; 310/365
(58) Field of Classification Search .................. 310/348, 310/365, 366; 439/9, 775, 799, 816, 834, 439/840, 862
See application file for complete search history.

(56) References Cited

U.S. PATENT DOCUMENTS

| | | | | |
|---|---|---|---|---|
| 6,521,970 | B1 * | 2/2003 | Takiar et al. | 257/522 |
| 2006/0151203 | A1 * | 7/2006 | Krueger et al. | 174/260 |
| 2006/0186540 | A1 * | 8/2006 | Buchwalter et al. | 257/737 |
| 2009/0046072 | A1 * | 2/2009 | Emig et al. | 345/173 |

OTHER PUBLICATIONS

Muhannad S. Bakir et al., "Chip Integration of Sea of Lands Compliant I/O Interconnections for the Ultimate Enabling of Chips with Low-k Interlayer Dielectrics", 2004 Electronic Components and Technology Conference.*
Muhannad S. Bakir et al., "Sea of Lands Ultra High-Density Compliant Wafer-Level Packaging Technology", 2002.*
Bing Dang et al., "Sea-of-Leads MEMS I/O Interconnects for Low-k IC Packaging", Journal of Microelectromechanical Systems, vol. 15, No. 3, Jun. 2006, pp. 523-530.

* cited by examiner

*Primary Examiner*—Walter Benson
*Assistant Examiner*—Derek J Rosenau
(74) *Attorney, Agent, or Firm*—Oliff & Berridge, PLC

(57) ABSTRACT

A printed circuit board includes a multiple-layer electrical circuit board and a nickel arm, wherein the nickel arm has an unconnected end located opposite to the connected end of the nickel arm, wherein the nickel arm has a front side and a backside located opposite to the front side of the nickel arm, wherein the backside of the nickel arm is located adjacent to the multiple layer electrical circuit board. A dimple is formed at the unconnected end of the nickel arm and on the front side of the nickel arm. An air gap is formed between the backside of the arm and the multiple layer electrical circuit board, wherein the air gap permits the arm to flex within the air gap. A lead zirconium titanate element is laminated to the printed circuit board, wherein the dimple on the front side of the arm contacts a surface of the lead zirconium titanate element, wherein a restoring spring force of the nickel arm maintains electrical contactivity between the dimple and the lead zirconium titanate element.

13 Claims, 6 Drawing Sheets

FIG. 3
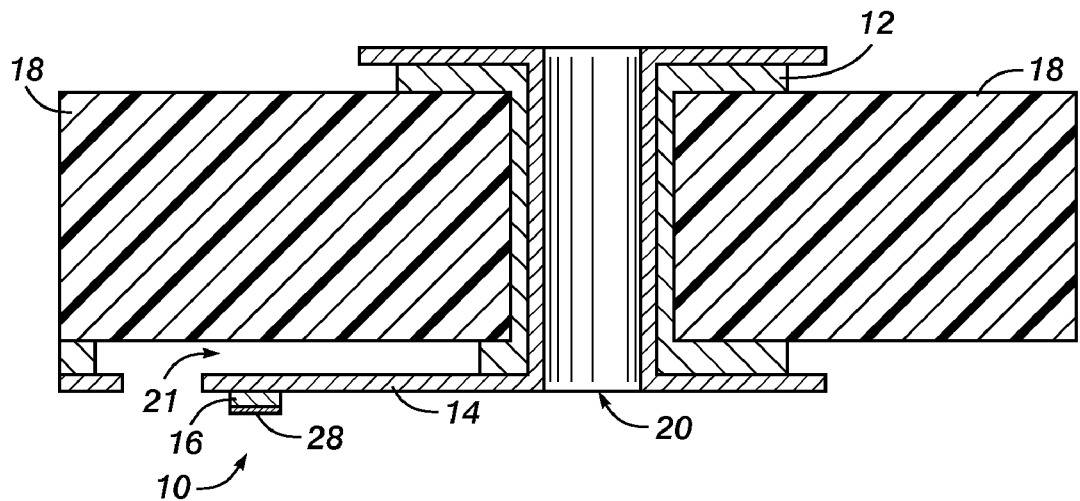
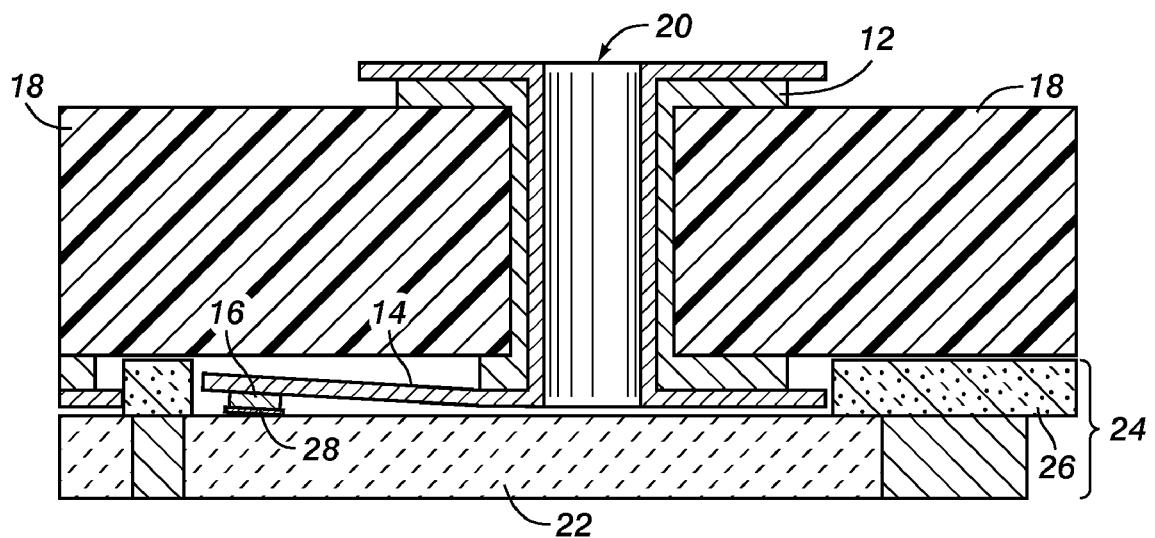
FIG. 4

NICKEL STRUCTURES AND METHODS FOR MANUFACTURING THE SAME BY REMOVAL OF AN UNDERLYING MATERIAL

BACKGROUND

Described herein are nickel structures and methods for manufacturing the nickel structures by removal of a portion of an underlying sacrificial material. The nickel structures and methods for manufacturing the nickel structures may include an array of cantilever nickel arms to provide electrical contacts for a printed circuit board (hereinafter "PC board"). The nickel arms may be released from the PC board by removing a portion of a sacrificial underlying material between the nickel arm and the body of the PC board.

The nickel arms may be used in applications that may require substantially similar stringent electrical requirements as required for a PC board within a solid ink printhead. For example, the cantilever nickel arms may be used in highly integrated sensing circuits or actuator driver electronics having to be mounted near a vibrating source. In embodiments, the cantilever nickel arms may be used to prevent heat damage to a PC board from dimensional fluctuations.

REFERENCES

Various PC boards providing several thousands of piezo elements with electrical interconnection contacts have been proposed for high density and wide format solid ink printheads. These various PC boards have provided improvements in electrical interconnection contacts for the piezo elements of the PC boards in solid ink printheads. However, as high density and wide format solid ink printheads and PC boards are manufactured at lengths greater than about 8 inches, a density of the piezo elements on the PC boards must be increased simultaneously to improve performance and extend media latitude or size range.

The piezo elements on PC boards require electrical interconnection contacts to provide electrical contacts for the PC boards within the solid ink printheads. The various PC boards provide electrical interconnection contacts made with silver epoxy droplets or conductive silicone adhesive droplets. The silver epoxy or conductive silicone adhesive droplets are applied to the PC board by screen printing the droplets through a stainless steel stencil to provide electrical interconnection contacts for the PC boards within the solid ink printhead. Silver epoxy and conductive silicon adhesive droplets perform poorly as electrical interconnection contacts when smaller sized droplets are required to be used on PC boards.

An increased density of piezo elements on PC boards requires use of smaller sized droplets for each piezo element to prevent overlap of or contact between more than one droplet. Overlap of or contact between more than one droplet causes the droplets to ineffectively provide electrical interconnection contacts for the piezo elements connected to the overlapping or contacting droplets. Without having an electrical interconnection contact provided by the droplets, the piezo elements connected to those droplets are inoperable.

Additionally, thousands of thermal cycles performed by the solid ink printhead may damage or destroy the droplets of the piezo elements because the small sized droplets are not resistant to thermal damage caused by each thermal cycle through the developing of hairline cracks. Damaged or destroyed droplets fail to provide electrical interconnection contacts for the piezo elements associated with the damaged or destroyed droplets. As a result, these piezo elements are inoperable.

Failure of as few as one piezo element on a PC board may cause a white line or non-printed area to appear on every page of paper printed thereafter by the solid ink printhead. Thus, failure of one or more piezo elements and/or one or more silver epoxy or conductive silicone adhesive droplets causes the PC board and solid ink printhead to be inoperable and unusable as a printing device.

One alternative to using silver epoxy or conductive silicone adhesive droplets for forming the electrical interconnection contacts is to make an array of electrical interconnection contacts with a flex cable and an anisotropic conductive film. However, designing and producing an array of electrical interconnection contacts with a flex cable and an anisotropic conductive film is costly, time consuming and have not been proven to work well at a density being targeted presently.

While current PC boards including piezo elements with electrical interconnection contacts made of silver epoxy or conductive silicone adhesive droplets are acceptable for their intended purposes within solid ink printheads, it is still desired to provide PC boards with improved interconnection structures for electrical interconnect contacting of piezo elements to improve production yield.

SUMMARY

PC boards having nickel structures provide electrical interconnect contacts for piezo elements having improved resistance to breaking, thermal damage and failure. Such improved PC boards with releasable nickel structures overcome one or more of the above problems to provide PC boards resistant to electrical interconnect contact failures and that are resilient.

In embodiments, disclosed is a structure that includes a multiple layer electrical circuit board having an arm, wherein the arm is nickel and has an unconnected end located opposite to a connected end of the arm, wherein the arm has a front side and a backside located opposite to the front side of the arm, wherein the backside of the arm is located adjacent to the multiple layer electrical circuit board. Moreover, the structure includes a dimple formed on the unconnected end on a front side of the arm and an air gap formed between the backside of the arm and the multiple layer electrical circuit board, permitting the arm to flex into a space of the air gap.

Also disclosed is a structure having a printed circuit board including a multiple-layer electrical circuit board having an arm, wherein the arm is nickel and has an unconnected end located opposite to a connected end of the arm, wherein the arm has a front side and a backside located opposite to the front side of the arm, wherein the backside of the arm is located adjacent to the multiple layer electrical circuit board. Further, the structure includes a dimple formed on the unconnected end on a front side of the arm and an air gap formed between the backside of the arm and the multiple layer electrical circuit board, permitting the arm to flex into a space of the air gap. Moreover, the structure includes a lead zirconium titanate element laminated to the printed circuit board, wherein the dimple contacts the lead zirconium titanate element, wherein a restoring spring force exerted by the arm maintains electrical contactivity between the dimple and the lead zirconium titanate element.

In further embodiments, disclosed is a method that includes forming a printed circuit board having a multiple layer electrical circuit board and an arm, wherein the arm is nickel and has an unconnected end located opposite to a connected end of the arm, wherein the arm has a front side and a backside located opposite to the front side of the arm, wherein the backside of the arm is adjacent to the multiple layer electrical circuit board, wherein a sacrificial underlying material connects the multiple layer electrical circuit board and the backside of the arm. Moreover, the method includes removing a portion of the sacrificial underlying material located between the backside of the arm and the multiple-layer electrical circuit board to form an air gap between the backside of the arm and the multiple layer electrical circuit board, permitting the arm to flex into a space of the air gap.

BRIEF DESCRIPTION OF THE DRAWINGS

FIG. 3 illustrates a cross-sectional view of a PC board having a nickel arm and a dimple with a thin layer of contacting material before lamination.

FIG. 4 illustrates a cross-sectional view of a PC board having a nickel arm and a dimple with a thin layer of contacting material after lamination.

EMBODIMENTS

Figure 1:
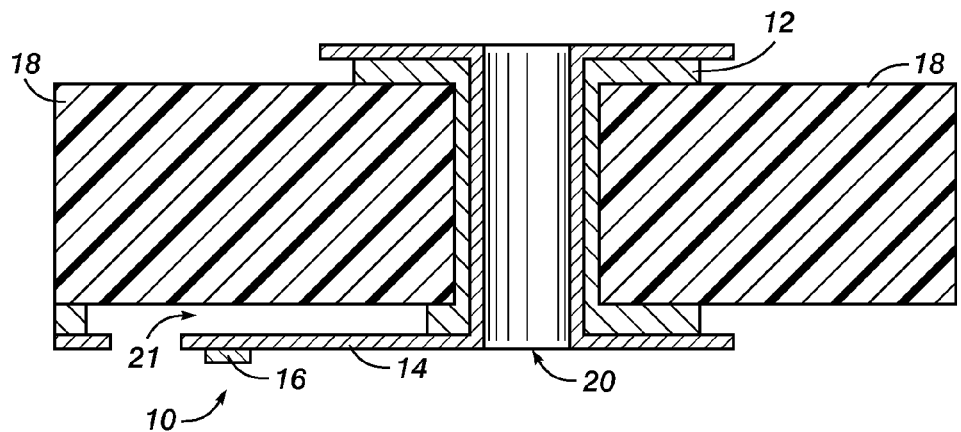
FIG. 1 illustrates a cross-sectional view of a PC board having a nickel arm and a dimple before lamination.

A nickel structure 10 may include a copper layer (hereinafter "copper layer 12") that acts as a supporting metal that binds nickel to a PC board, at least one cantilever nickel arm 14 (hereinafter "arm 14"), and a photo defined structure 16 (hereinafter "dimple 16") connected to the arm 14 is shown in FIGS. 1-4. The nickel structure 10 includes the dimple 16 on the arm 14 as shown in FIGS. 1-7. The PC board may include a multiple layer electrical circuit board 18 (hereinafter "ECB 18"). Material of the dimple 16, such as nickel, may have a high melting temperature so that the dimple 16 may be polished to increase electrical contactivity properties of the dimple 16.

Traditional PC board formation processes only involve one masking act, such as plating a layer of the metal onto the arm 14. The present method includes a second masking act of plating additional metal material on the arm 14 to form the dimple 16 thereon.

In embodiments, a cylindrical metal insert 20 as shown in FIGS. 1-4 may be used to connect each layer in the PC board. In further embodiments, holes or vias, not shown, may be used. Rather than passing through the entire PC board as with the cylindrical metal insert 20, the holes or vias do not pass through the entire PC board and only connect some of the copper layers. Holes or vias are called "blind vias" when they connect, for example, an internal copper layer to an external copper layer. Holes or vias are called "buried vias" when they connect, for example, two or more internal copper layers and no external copper layers.

The arm 14 may have a length defined between a connected end and an unconnected end located opposite to the connected end of the arm 14. In embodiments, the connected end of the arm 14 may be adjacent to and/or connected to the cylindrical metal insert 20 of the PC board. In further embodiments, the connected end of the arm 14 may be adjacent to and/or connect to a remaining portion of the underlying sacrificial material that will bind the arm 14 to the PC board when a cylindrical metal insert is not used. The arm 14 may have a thickness, such as from about 6 microns to about 25 microns, about 8 microns to about 20 microns, or about 10 microns to about 15 microns.

The arm 14 may have a front side and a backside that may be located opposite to the front side of the arm 14. The backside of the arm 14 may be adjacent to or facing the ECB 18. The front side of the arm 14 may be facing outwardly with respect to the body of the PC board. The dimple 16 is desirably located on the front side of the arm, for example as shown in FIG. 1.

An air gap 21 may be located between the backside of the arm 14 and the ECB 18. The air gap 21 between the arm 14 and the ECB 18 may have a thickness of about 15 microns to about 45 microns, about 25 microns to about 45 microns, about 30 microns to about 40 microns or about 35 microns to about 40 microns. The unconnected end of the arm 14 may be mechanically decoupled and separated from the ECB 18 as shown in FIGS. 1-4.

In the method for manufacturing the nickel structures, a precursor metal, such as copper, may connect the backside of the arm 14 to the ECB 18. The precursor metal that connects the arm 14 and the ECB 18 forms the sacrificial underlying material between the arm 14 and the ECB 18. The sacrificial underlying material is a part of the copper layer 12 that is between the arm 14 and the body of the PC board. For example, air gap 21 in FIG. 1 is the portion of the sacrificial underlying material between the arm 14 and body of the PC board that has been removed.

Figure 2:
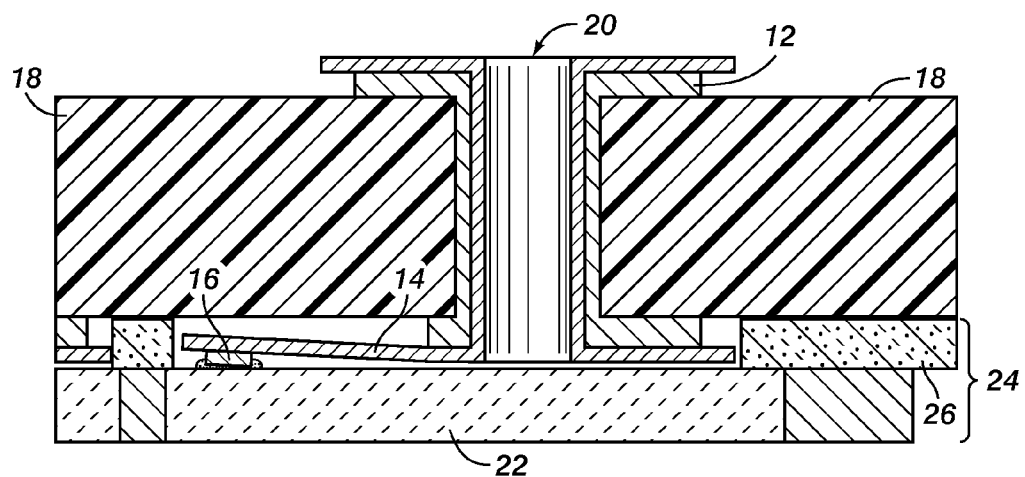
FIG. 2 illustrates a cross-sectional view of a PC board having a nickel arm and a dimple after lamination.

The sacrificial underlying material between the arm 14 and the ECB 18 may be partially removed via chemical etching to release and separate the arm 14 from the body of the PC board. That is, the sacrificial underlying material underneath the arm 14 is removed in an amount necessary for the backside and/or unconnected end of the arm 14 to be decoupled or released from the ECB 18 of the body of the PC board. In embodiments, the connected end of the arm 14 may remain connected to the remaining underlying sacrificial material (not shown) when a cylindrical metal insert is not used. In further embodiments, the connected end of the arm 14 may remain connected to the cylindrical metal insert 20 of the PC board as shown in FIG. 2. By removing a portion of the sacrificial underlying material from the backside of the arm 14 and the ECB 18, the air gap 21 may be formed between the backside of the arm 14 and the ECB 18. As a result, the backside of the arm 14 may not contact the ECB 18 as shown in FIGS. 1-4. However, the chemical etching should be stopped once the portion of the underlying sacrificial material between the arm 14 and the body of the PC board is removed so remaining underlying sacrificial material is not corroded. For example, if the underlying sacrificial material is not adequately removed, the remnants can interfere with the bending of the arm 14. However, the arm 14 is desirably not removable via the chemical etching, and remains following the etching. In embodiments, the chemical used for etching is, for example, citric acid or COPPER ETCHANT 49-1 available from Transene Company, Inc., neither of which have solid residuals as byproducts.

The dimple 16 on the arm 14 may be formed by plating additional metal material, such as nickel. The dimple 16 may be formed at or near the unconnected end of the arm 14. The dimple 16 may have a thickness of about 30 microns to about 70 microns, about 40 microns to about 60 microns or about 45 microns to about 55 microns. The dimple 16 formed at the unconnected end of the arm 14 may be released with respect to the ECB 18 because the unconnected end of the arm may be mechanically decoupled and released from the ECB 18.

Figure 7:
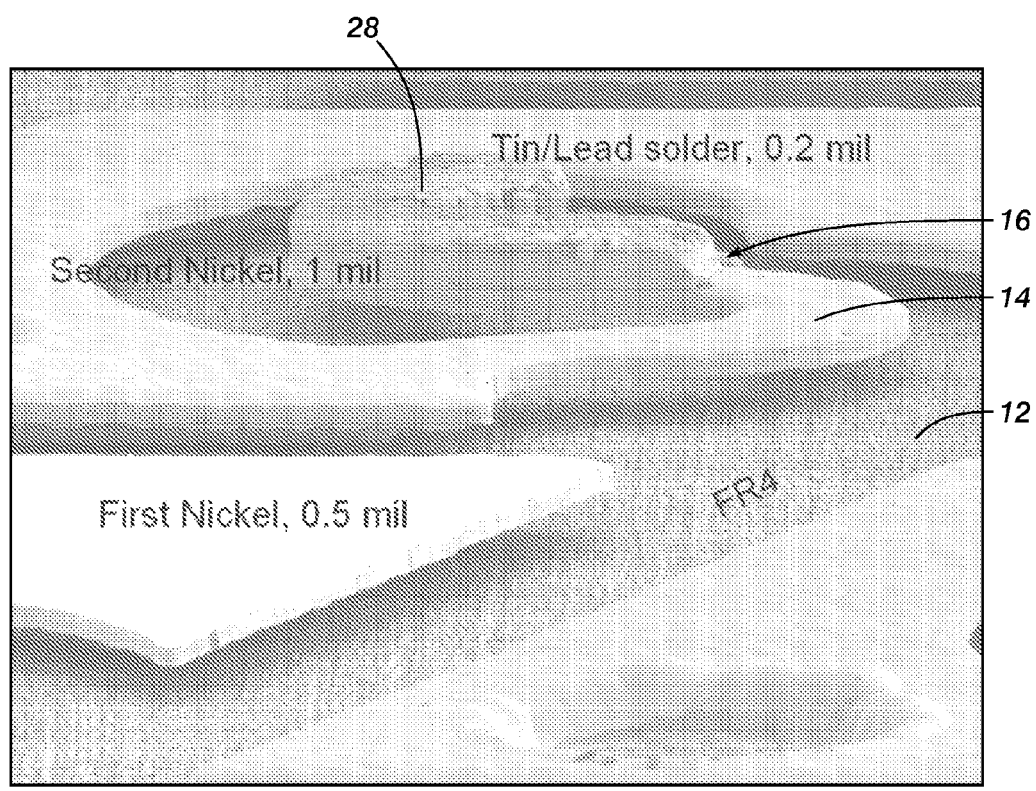
FIG. 7 illustrates a nickel arm having a contacting material on top of a dimple.

FIG. 7 shows a scanning electron microscope photograph of the arm 14 having the dimple 16 at the unconnected end on the front side of the arm 14. Further, the contacting material 28 is formed on the unconnected end of the arm 14. FIG. 7 illustrates that after the portion of the sacrificial underlying material is removed from the arm 14, the arm 14 forms a cantilevered springy component. The arm 14 may exhibit spring-like characteristics such that the arm 14 may bounce up and down and move about 30 microns, without deformation or destruction when contacted by a probe needle.

The traditional PC board formation processes terminate wet etching of the PC boards as soon as the precursor metal on the arms begin to disappear from the front sides of the arms. Traditional PC board formation processes only require the arms to be electrically separated from other arms on the PC boards to provide electrical interconnecting contacts for the PC boards. Thus, in traditional PC board formation, precursor metal remains between the arms so that the backsides of the arms remain mechanically connected to the PC boards.

In the method for manufacturing the nickel structures herein, the body of the PC board and the arm 14 are exposed to the chemical etchant for a longer duration of time than in traditional PC board formation processes, for example, about two hours, so that a portion of the sacrificial underlying material is etched away to form the air gap 21. As a result, removing the portion of the sacrificial underlying material forms the arm 14 into a cantilevered arm having a narrower cross-section to mechanically decouple or release the unconnected end of the arm 14 from the copper layer 12.

If the body of the PC board and the arm 14 are overexposed to the chemical etchant, for example, about one week, the arm 14 may be fully separated from the PC board and may flow away into a solution that contains the chemical etchant. FIGS. 1 and 3 illustrate the arm 14 having the dimple 16 formed thereon after chemical etching so that the arm 14 is mechanically decoupled and separated from the body of the PC board.

After a portion of the sacrificial underlying material is removed from the body of the PC board and the arm 14 is formed, the functional layers may be laminated and may have a combined thickness of about 75 microns to about 100 microns.

The nickel structure 10 may have a contacting material 28 at a contact point where the dimple 16 contacts a functional layer, such as a lead zirconium titanate element 22 (hereinafter "PZT element 22") as shown in FIGS. 2 and 4. The contacting material 28 may alternatively be located on the functional layer at the contact points with the dimple 16. The contacting material 28 may improve electrical contactivity properties between the arm 14 and the PZT element 22. In embodiments, the contacting material 28 may be made of silver epoxy, tin, lead, a tin-lead mixture or mixtures thereof.

In embodiments, the contacting material 28 may be a metal solder as shown in FIG. 4. The metal solder of the contacting material 28 may be applied to the dimple 16 before the PC board may be connected to the PZT element 22. The metal solder of the contacting material 28 may be applied to the dimple 16 by, for example, masking and the like. In embodiments, application and use of the metal solder for the contacting material 28 may be simpler, less time-consuming and less expensive than use of the metal epoxy for the contacting material 28. The metal solder that may be applied to the dimple may have a thickness of about 4 microns to about 6 microns.

The contacting material 28 may be applied at the contact point where the dimple 16 contacts or abuts the PZT element 22 as shown in FIGS. 2 and 4. The contacting material 28 may have sufficient interaction between the nickel on the arm 14 so that the electrical contactivity is maintained between the arm 14 and the PZT element 22. As a result, the contacting material 28 may prevent breakage, termination of the electrical contactivity or oxidation between the arm 14 and the PZT element 22. The contacting material 28 may increase or improve contactivity properties between the dimple 16 of the arm 14 and the PZT element 22. As a result, the contacting material 28 may maintain the electrical connection between the arm 14 and the PZT element 22.

In embodiments, the contacting material 28 may be a metal epoxy that is applied at the contact point of the dimple 16 and the PZT element 22 as illustrated in FIG. 2. Suitable metal epoxy used for the contacting material 28 may include silver epoxy and the like.

In embodiments, the metal epoxy for the contacting material 28 may be applied to the arm 14 prior to connecting the PC board to the PZT element 22. Application of the metal epoxy to the arm 14 may be by, for example, wetting. When wetting is used to apply the metal epoxy, the metal epoxy may only wet a top of the dimple 16 at the unconnected end of the arm 14 without wetting any other area of the dimple 16 and the arm 14. If excessive metal epoxy is applied to the arm 14, the metal epoxy may bridge across from the dimple 16 to the connected end of the arm 14 or between the arm 14 and the body of the PC board. As a result, the arm 14 may be inoperable because the restoring spring force is hampered by the excessive metal epoxy, and the arm 14 cannot move laterally. In embodiments, the amount of metal epoxy applied at the contact point is about 5 microns.

In embodiments, other means for making contact with inner layers or a layer on an opposite side may be used, such as laser ablation.

During lamination of the array 24, the arm 14 may be pushed inwardly with respect to a body of the PC board by at least one of the functional layers, such as the PZT element 22 as shown in FIGS. 1-4. For example, when the array 14 is laminated to the PC board, the PZT element 22 abuts the arm 14 of the PC board and pushes the arm 14 inward with respect to the body of the PC board.

The nickel structure 10 may be used in conjunction with a PZT element 22 and the adhesive material 26 to form an array 24 as shown in FIGS. 2 and 4. In embodiments, the adhesive material 26 may attach or secure the PZT element 22 to the ECB 18. The adhesive material 26 may alternatively be located between the arm 14 and the PZT element 22 and thus attach the PZT element 22 to the arm 14. In embodiments, the adhesive material 26 may be, for example, acrylic film adhesive, RF-1500 available from Rogers Corporation, and the like.

The arm 14 and the dimple 16 may be forced or bent inwardly with respect to the ECB 18 by the PZT element 22 when the array 24 is formed and/or laminated as shown in FIGS. 2 and 4. As a result, the unconnected end of the arm 14 may be compressed inwardly with respect to the ECB 18 by a distance of about 5 microns to about 30 microns, about 10 microns to about 25 microns or about 15 microns to about 20 microns. Compression of the unconnected end of the arm 14 may cause the arm 14 to exert a restoring spring force outwardly with respect to the PZT element 22. The restoring spring force of the arm 14 may push or force the dimple 16 inwardly with respect to the PZT element 22 of the array 24. As a result, the dimple 16 may abut or contact the PZT element 22 by the restoring spring force of the arm 14. In embodiments, the restoring spring force of the arm 14 that may be exerted against the PZT element 22 may be about 1 gram force to about 2 gram force.

The arm 14 may be continuously or uniformly in contact with or separately connected to the PZT element 22 via the dimple 16. As a result, the dimple 16 maintains electrical interconnect contact between the arm 14 and the PZT element 22. Moreover, a circuit (not shown in the figures) that may be electrically connected to the arm 14 may remain in electrical interconnect contact with the PZT element 22 via the dimple 16 of the arm 14. The front side of the arm 14 may be separated from the PZT element 22 by a distance of about 30 microns to about 70 microns, that is, the thickness of the dimple 16.

The restoring spring force of the arm 14 that maintains electrical continuity and contactivity between the arm 14 and the PZT element 22 may be substantially similar to restoring spring force utilized in, for example, a land grid array (hereinafter "LGA") used on microprocessors having a Socket F with 1207 Pins. For example, the restoring spring force of the arm 14 may be equal to or substantially equal to the restoring spring force in a LGA array of heat treated/stamped BeCu springs plated with a layer of nickel having a thickness of about 0.76 microns.

Figure 5:
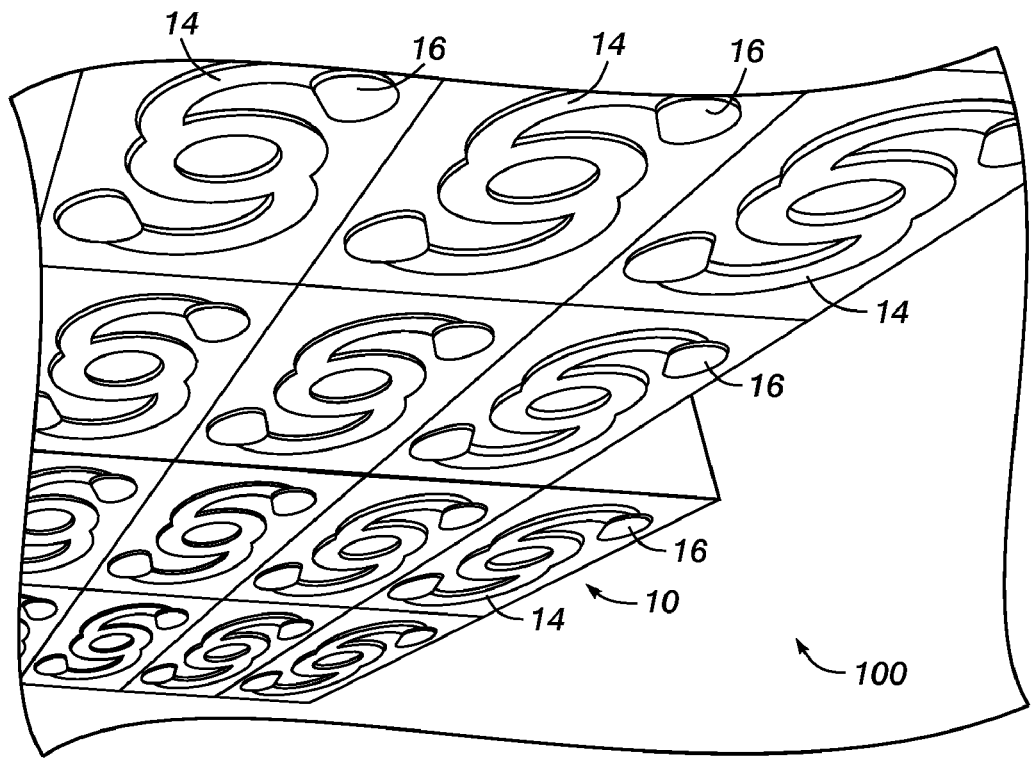
FIG. 5 illustrates an array of nickel arm contact elements having two nickel arms.
Figure 6:
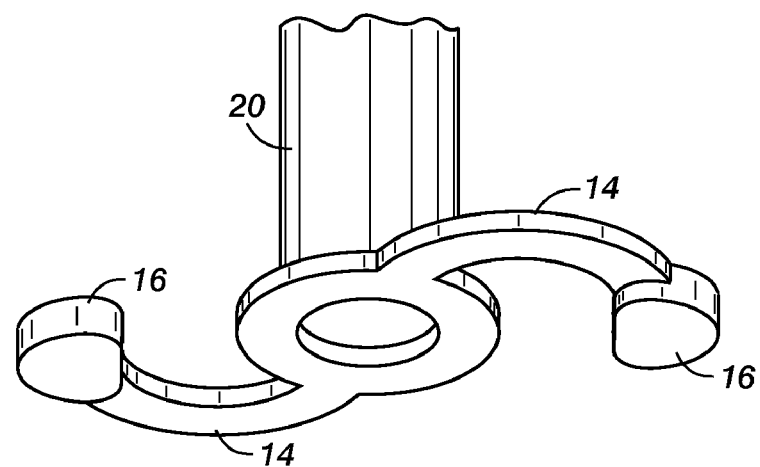
FIG. 6 illustrates a conducting part of a nickel arm contact element having a cylindrical metal insert.

Multiple nickel structures 10 may be derived from a structure array 100 as shown in FIG. 5. Each nickel structure 10 in the array 100 may have a configuration as shown in FIGS. 5 and 6. The nickel structure 10 may be configured to include two arms 14 and may have a spiral or circular shape as shown in FIGS. 5 and 6.

The configuration of the nickel structure 10 may be sufficiently electronically designed with a 2-dimensional drafting application, such as AUTOCAD LT to produce an electronic design for the configuration of the nickel structure 10. In embodiments, the electronic design may be converted to, for example GERBER data which is used by the PC board manufacturers. As a result, the electronic design may be integrated into full feature schematic and layout applications, such as CADENCE.

Figure 8:
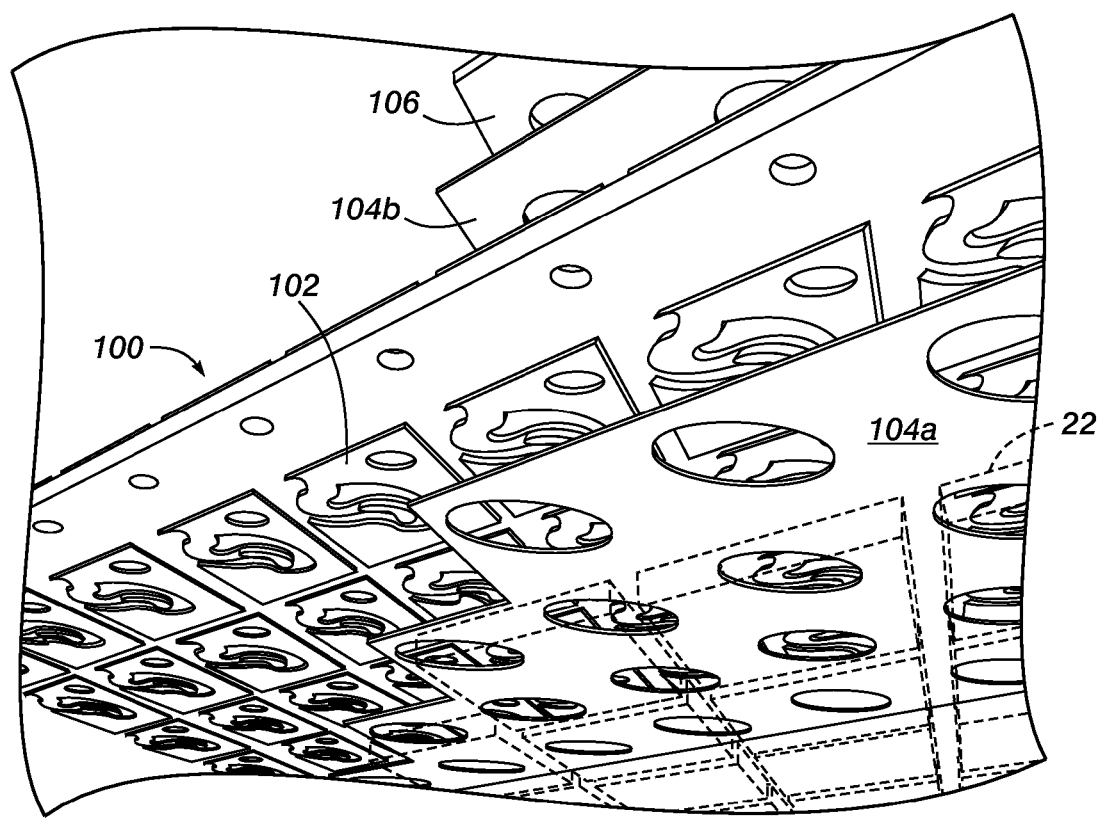
FIG. 8 illustrates a lamination unit including an interposer board, a product PC board, adhesive films and a lead zirconium titanate layer.

An interposer board 102 may include the structure array 100 as shown in FIG. 8. In embodiments, the interposer board 102 may contain, for example, several hundreds, several thousands or several tens of thousands of the arms. The interposer board 102 may vary in length, for example about 4 inches to about 36 inches or about 6 inches to about 10 inches. The interposer board 102 may be insertable between a known product PC board and a known printhead jetstack.

After the interposer board 102 is formed, the interposer board 102 may be connected to front side and backside adhesive films 104a and 104b as shown in FIG. 8. In embodiments, the interposer board 102 may be heat-tacked with the adhesive films 104a and 104b. In embodiments, the adhesive films 104a and 104b may be translucent and/or laser-defined adhesive films. After the interposer board 102 is connected to the adhesive films 104a and 104b, the interposer board 102 may be connected to a product circuit board 106 and the PZT element 22. In embodiments, the interposer board 102 may be laminated to the product PC board 106 and the PZT element 22 in an oven.

The interposer board 102 may have a front side and a backside opposite to the front side of the interposer board 102. The front adhesive film 104a may be laminated adjacent to the front side of the interposer board 102. The PZT element 22 may be laminated onto the front adhesive film 104a. As a result, the front adhesive film 104a may be located between the interposer board 102 and the PZT element 22.

The backside adhesive film 104b may be laminated adjacent to the backside of the interposer board 102. The product PC board 106 may be laminated onto the backside adhesive film 104b. As a result, the backside adhesive film 104b may be located between the interposer board 102 and the product PC board 106.

Figure 9:
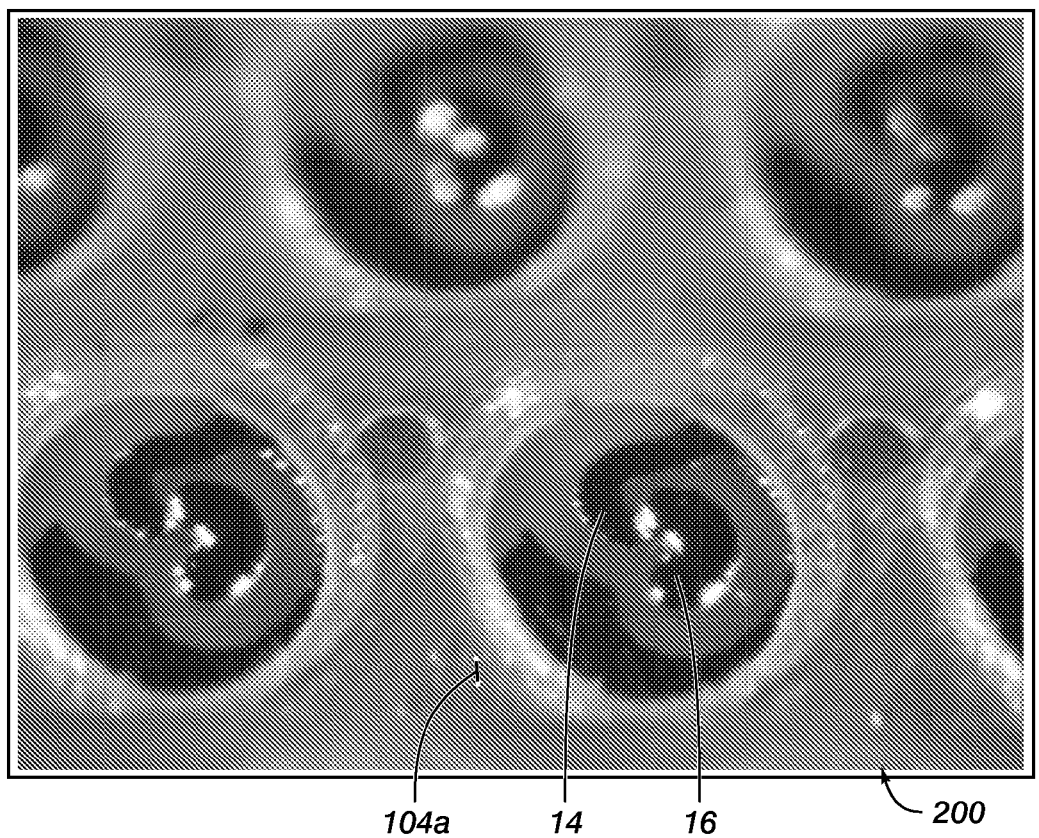
FIG. 9 illustrates a front side of an interposer board viewed through an adhesive film.

FIG. 9 illustrates the front side of the structure array 100 having more than one arm 14 and dimple 16 as viewed through air gaps 200 in the front side or backside adhesive films 104a and 104b. The backside of the structure array 100 may have more than one arm 14 that correspond to and are electrically connected to the more than one arm 14 of the front side of the structure array 100. The backside and the front side of the structure array 100 may be securely connected to the product PC board 106 and the PZT element 22, respectively, before an electrical voltage can be transmitted from the product PC board 106 through the more than one arm 14 of the backside and the front side of the product PC board and onto the PZT element 22.

The laminated unit including the product PC board 106, the interposer board 102, the front and backside adhesive films 104a, 104b and the PZT element 22 may be tested for shorting from a circuit board to a surrogate metal board. The laminated unit exhibited shorts that indicate a sufficient contact via the more than one arm 14 on the backside and front side of the interposer board 102. The laminated unit may be subjected to a thermal cycles at a temperature up to about 130° C. and down to room temperature by passing a current through a heater coil embedded within the product PC board 106.

It will be appreciated that various of the above-disclosed and other features and functions, or alternatives thereof, may be desirably combined into many other different systems or applications. Also, it will be appreciated that various presently unforeseen or unanticipated alternatives, modifications, variations or improvements therein may be subsequently made by those skilled in the art which are also intended to be encompassed by the following claims. Unless specifically recited in a claim, steps or components of claims should not be implied or imported from the specification or any other claims as to any particular order, number, position, size, shape, angle, color, or material.

What is claimed is:

1. A structure comprising:
    a multiple-layer electrical circuit board having an arm, wherein the arm has a connected end connected to the multiple-layer electrical circuit board and an unconnected end located opposite to the connected end of the arm, wherein the arm has a front side and a backside located opposite to the front side of the arm, wherein the backside of the arm is located adjacent to the multiple layer electrical circuit board,
    a dimple formed on the unconnected end on a front side of the arm,
    an air gap formed between the backside of the arm and the multiple-layer electrical circuit board, permitting the arm to flex into a space of the air gap, wherein the air gap is a completely empty space extending from the backside of the unconnected end of the arm to the multiple-layer electrical circuit board, and the air gap measured from the backside of the arm to the multiple-layer electrical circuit board is about 15 microns to about 45 microns, and
    an adhesive film laminated to the printed circuit board, wherein the adhesive film is translucent and includes openings to permit the arm to pass therethrough.

2. The structure according to claim 1, wherein the arm has a thickness from about 6 microns to about 25 microns.

3. The structure according to claim 1, wherein the dimple has a thickness of about 30 microns to about 70 microns.

4. The structure according to claim 1, wherein the arm is nickel.

5. A structure comprising:
- a printed circuit board including
- a multiple-layer electrical circuit board having an arm, wherein the arm has a connected end connected to the multiple-layer electrical circuit board and an unconnected end located opposite to the connected end of the arm, wherein the arm has a front side and a backside located opposite to the front side of the arm, wherein the backside of the arm is located adjacent to the multiple layer electrical circuit board,
- a dimple formed on the unconnected end on a front side of the arm,
- an air gap formed between the backside of the arm and the multiple-layer electrical circuit board, permitting the arm to flex into a space of the air gap, wherein the air gap is a completely empty space extending from the backside of the unconnected end of the arm to the multiple-layer electrical circuit board; and
- a lead zirconium titanate element laminated to the printed circuit board, wherein the dimple contacts the lead zirconium titanate element and wherein the arm is flexed into the air gap toward the multiple-layer electrical circuit board, wherein a restoring spring force of about 1 gram force to about 2 gram force is exerted by the flexed arm to maintain electrical contactivity between the dimple and the lead zirconium titanate element.

6. The structure according to claim 5, further comprising:
- contact material applied at a contact point between the dimple of the arm and the lead zirconium titanate element.

7. The structure according to claim 6, wherein the contact material is a metal epoxy or a layer of metal solder.

8. The structure according to claim 7, wherein the metal epoxy is silver epoxy or the layer of metal solder is made of silver, tin, lead or combinations thereof and has a thickness of about 5 microns.

9. The structure according to claim 5, further comprising:
- an adhesive film laminated to the printed circuit board or the lead zirconium titanate element, wherein the adhesive film is translucent.

10. The structure according to claim 5, wherein the arm has a thickness from about 6 microns to about 25 microns.

11. The structure according to claim 5, wherein the dimple has a thickness of about 30 microns to about 70 microns.

12. The structure according to claim 5, wherein the air gap measured from the backside of the arm to the multiple-layer electrical circuit board is about 15 microns to about 45 microns.

13. The structure according to claim 3, wherein the arm is nickel.

* * * * *